(12) United States Patent
Li et al.

(10) Patent No.: US 12,464,699 B2
(45) Date of Patent: Nov. 4, 2025

(54) SEMICONDUCTOR STRUCTURE AND FORMING METHOD THEREOF

(71) Applicant: HeFeChip Corporation Limited, Hong Kong (CN)

(72) Inventors: Liang Li, Singapore (SG); Chunyu Wong, Clifton Park, NY (US); John H Zhang, Altamont, NY (US); Yanzun Li, Lagrangeville, NY (US); Huang Liu, Mechanicville, NY (US); Yuan Lung Lin, Zhubei (TW); Haijiang Yuan, Shanghai (CN); Chung-Chiang Lin, Qonglin (TW)

(73) Assignee: HEFECHIP CORPORATION LIMITED, Hong Kong (CN)

( * ) Notice: Subject to any disclaimer, the term of this patent is extended or adjusted under 35 U.S.C. 154(b) by 418 days.

(21) Appl. No.: 18/088,944

(22) Filed: Dec. 27, 2022

(65) Prior Publication Data

US 2024/0215218 A1    Jun. 27, 2024

(51) Int. Cl.
*H10B 12/00* (2023.01)

(52) U.S. Cl.
CPC ....... *H10B 12/0387* (2023.02); *H10B 12/056* (2023.02); *H10B 12/36* (2023.02); *H10B 12/373* (2023.02)

(58) Field of Classification Search
CPC .............. H10B 12/0387; H10B 12/373; H10B 12/056; H10B 12/36
See application file for complete search history.

(56) References Cited

U.S. PATENT DOCUMENTS

| | | | |
|---|---|---|---|
| 2004/0198105 A1* | 10/2004 | Dove | G06F 13/4072 439/894 |
| 2011/0042729 A1 | 2/2011 | Chen et al. | |
| 2014/0004677 A1 | 1/2014 | Li et al. | |
| 2015/0214239 A1 | 7/2015 | Rhie | |
| 2019/0279987 A1* | 9/2019 | Chan | H10D 86/01 |
| 2025/0142844 A1* | 5/2025 | Hu | H10D 1/665 |

FOREIGN PATENT DOCUMENTS

| | | |
|---|---|---|
| CN | 115132775 A | 9/2022 |
| CN | 115346984 A | 11/2022 |

* cited by examiner

*Primary Examiner* — Richard A Booth
(74) *Attorney, Agent, or Firm* — MUNCY, GEISSLER, OLDS & LOWE, P.C.

(57) ABSTRACT

A semiconductor structure and a method of forming it are disclosed by the present application. Deep trench capacitors are formed in a substrate, and fin contacts formed by upper portions of inner electrodes in the deep trench capacitors are connected to fins on a surface of the substrate. At least one of word lines formed on the substrate pass over and are separated by a word line isolation layer from the inner electrodes. The word line isolation layer covers portions of the inner electrodes between a buried oxide layer and the fin contacts, while the fins are exposed therefrom.

8 Claims, 8 Drawing Sheets

SEMICONDUCTOR STRUCTURE AND FORMING METHOD THEREOF

TECHNICAL FIELD

The present invention relates to the field of semiconductor technology and, in particular to a semiconductor structure and a method of forming it.

BACKGROUND

Motivated by miniaturization and advanced chip designs, dynamic random access memory (DRAM), which is used in sophisticated computing systems as key memory, are evolving toward high speed, high density and low power consumption. For example, embedded DRAM (eDRAM) in chips with logic functions can, in some cases, replace conventional static random access memory (SRAM) for lower power consumption.

Deep trench capacitors and stack capacitors are the two most dominant DRAM capacitor technologies. Between them, deep trench capacitors are more suitable for the integration of eDRAM and logic because their deep trenches can be formed before the construction of CMOS transistors. During the co-fabrication of a deep trench capacitor and a CMOS transistor, a deep trench may be first formed in a substrate, and an inner electrode of the capacitor may be then formed in the deep trench. Subsequently, the CMOS transistor may be fabricated so that its source/drain region is connected to the inner electrode of the deep trench capacitor. However, existing processes tend to cause defects at an opening of the deep trench, which may affect the performance of the device being fabricated. For example, subsequent to the formation of the inner electrode of the capacitor in the deep trench, as well as of a gate of the CMOS transistor and spacers on sidewalls of the gate outside the deep trench, a surface of the inner electrode (e.g., doped polysilicon) will be exposed, and during a subsequent source/drain epitaxial process for the CMOS transistor, an undesired epitaxial structure may also be formed on the exposed surface of the inner electrode. Part of this epitaxial structure formed on the surface of the inner electrode tends to come into contact with an electrical structure on the substrate that is supposed to be isolated from the inner electrode (e.g., a source/drain epitaxial structure of another CMOS transistor) and may thus possibly lead to a short circuit in the device.

Therefore, the existing eDRAM technology is not reliable and further improvement is needed.

SUMMARY OF THE INVENTION

In order to provide an improvement in the existing eDRAM technology, the present invention presents a method of forming a semiconductor structure and a semiconductor structure.

In one aspect, the present invention provides a method of forming a semiconductor structure, comprising:

providing a substrate comprising a doped substrate layer, a buried oxide layer and a device layer;

forming at least one deep trench in the substrate, wherein each deep trench extends through the device layer and the buried oxide layer into the doped substrate layer;

forming a corresponding deep trench capacitor in each deep trench, wherein the deep trench capacitor comprises a node dielectric layer covering a part of an inner surface of the deep trench and an inner electrode filled in the deep trench, and wherein the node dielectric layer separates the inner electrode from the doped substrate layer;

etching the device layer and the inner electrodes to expose the underlying buried oxide layer, wherein the etched device layer forms at least one fin and a portion of the etched inner electrode forms a fin contact connected to the corresponding fin;

forming a word line isolation layer on the substrate, wherein the fin is exposed from the word line isolation layer;

forming word lines on the substrate, wherein at least one of the word lines intersects the at least one fin and provides a gate of a transistor on a surface of each fin, and at least one of the word lines pass over and are separated by the word line isolation layer from the inner electrodes;

forming spacers on sidewalls of each word line, wherein the word line isolation layer covers a surface of a portion of the inner electrode between the buried oxide layer and the fin contact; and performing an epitaxial process to form a source/drain epitaxial structure on the surface of the fin on opposite sides of the gates.

In another aspect, the present invention provides a semiconductor structure, comprising:

a substrate comprising a doped substrate layer, a buried oxide layer and a device layer, wherein the device layer forms at least one fin;

at least one deep trench capacitor formed in the substrate, wherein the deep trench capacitor comprises an inner electrode formed in a deep trench in the substrate and a node dielectric layer between the inner electrode and the doped substrate layer, wherein each of the deep trench and the inner electrode extends through the device layer and the buried oxide layer into the doped substrate layer, and wherein the inner electrode comprises a fin contact connected to a corresponding fin;

word lines formed on the substrate, wherein at least one of the word lines intersects the at least one fin and provides a gate of a transistor formed on a surface of each fin, wherein sidewalls of each word line are covered by spacers;

a word line isolation layer formed on the substrate, wherein at least one of the word lines passes over and is separated by the word line isolation layer from the inner electrodes, wherein the word line isolation layer covers a surface of a portion of the inner electrode between the buried oxide layer and the fin contact, and wherein the fin is exposed from the word line isolation layer; and a source/drain epitaxial structure formed on the surface of the fin located on opposite sides of the word lines.

In the semiconductor structure and method provided in the present invention, the fin contacts formed by upper portions of the inner electrodes in the deep trench capacitors formed in the substrate are connected to the fins formed by the device layer, and at least one of the word lines on the substrate passes over and is separated by the word line isolation layer from the inner electrodes. The word line isolation layer covers portions of the inner electrodes between the buried oxide layer and the fin contacts, while the fins are exposed from the word line isolation layer. The word line isolation layer functions not only to insulate and isolate the word lines from the inner electrodes but also to prevent the portion of the inner electrodes between the buried oxide layer and the fin contacts from being exposed

DETAILED DESCRIPTION

The proposed semiconductor structure and method will be described in greater detail below by way of specific embodiments with reference to the accompanying drawings. It is to be understood that the figures are provided in a very simplified form not necessarily drawn to exact scale for the only purpose of facilitating easy and clear description of the embodiments. Additionally, as used herein, spatially relative terms are intended to encompass different orientations of the device in use or operation in addition to the orientation depicted in the figures. For example, if the device in the figures is inverted or otherwise oriented (e.g., rotated), the exemplary term "over" can encompass an orientation of "under" and other orientations.

Embodiments of the present invention relate to a method of forming a semiconductor structure. This method can be used to make an eDRAM device including deep trench capacitors with a large capacity. In the method, a word line isolation layer is formed to isolate passing word lines above the deep trench capacitors from inner electrodes of the deep trench capacitors. Additionally, the word line isolation layer is so formed as to cover, during an epitaxial process, at least surfaces of the portions of the inner electrodes in the deep trenches surrounding respective fin contacts to control areas of the inner electrode surfaces for epitaxial growth to avoid a short circuit that may be caused by contact of epitaxial structures formed on the inner electrode surfaces with any electrical structure on the substrate that is supposed to be isolated from the inner electrodes. This helps improve the reliability and performance of the semiconductor structure being fabricated.

Figure 1A:
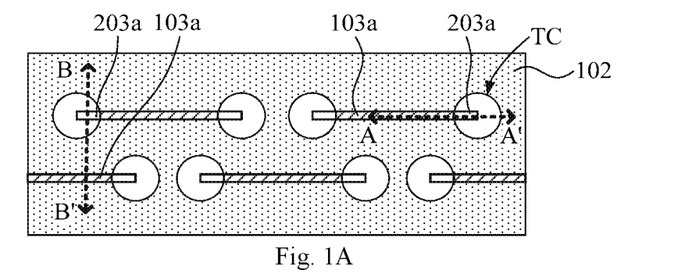
FIG. 1A is a schematic plan view showing the formation of deep trench capacitors in a substrate and of fins and fin contacts according to an embodiment of the present invention.
Figure 1B:
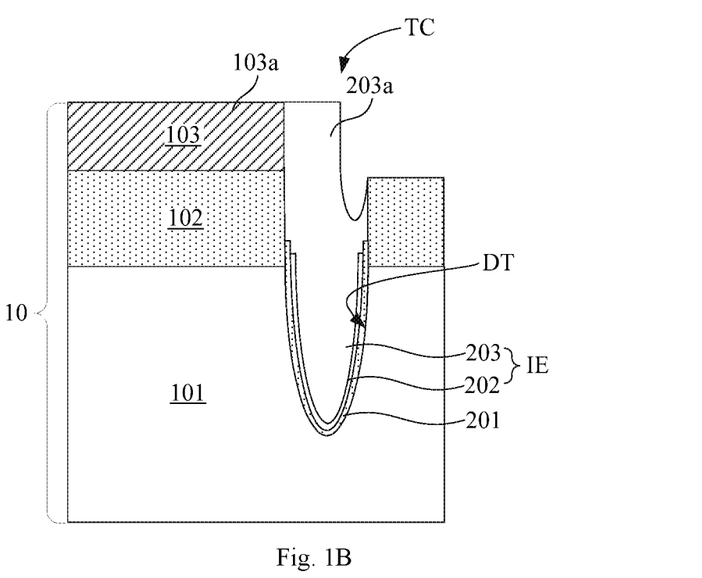
FIG. 1B is a schematic cross-sectional view taken along line AA' of FIG. 1.
Figure 1C:
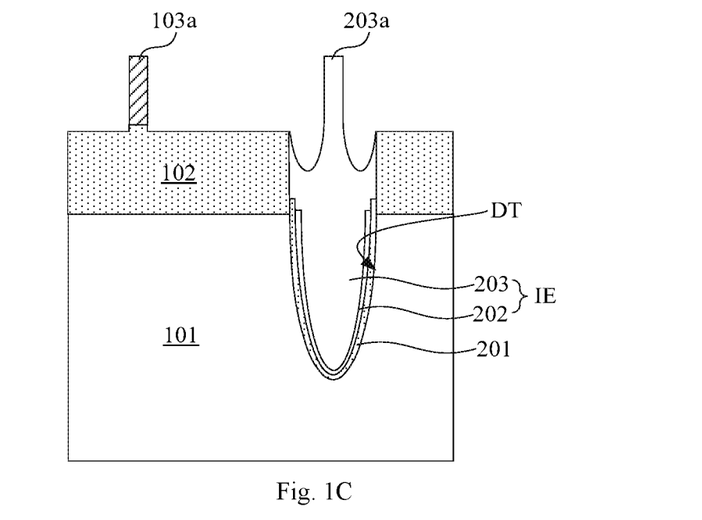
FIG. 1C is a schematic cross-sectional view taken along line BB' of FIG. 1.

FIG. 1A is a schematic plan view showing the formation of deep trench capacitors in a substrate and of fins and fin contacts according to an embodiment of the present invention. FIG. 1B is a schematic cross-sectional view taken along line AA' of FIG. 1. FIG. 1C is a schematic cross-sectional view taken along line BB' of FIG. 1. As shown in FIGS. 1A to 1C, in a method of forming a semiconductor structure according to an embodiment of the present invention, a substrate 10 is first provided, which includes a doped substrate layer 101, a buried oxide layer 102 on the doped substrate layer 101 and a device layer 103 on the buried oxide layer 102. In an embodiment, the substrate 10 is a silicon-on-insulator (SOI) substrate, and the doped substrate layer 101 is, for example, a heavily doped N-type silicon substrate. The buried oxide layer 102 is, for example, a silicon oxide layer, and the device layer 103 is, for example, a P-type silicon layer. The doped substrate layer 101 has a thickness in the range of, for example, 50-500 µm. The buried oxide layer 102 has a thickness in the range of, for example, 100-500 nm. The device layer 103 has a thickness in the range of, for example, 50-500 nm. However, the present invention is not so limited.

As shown in FIGS. 1A to 1C, deep trench capacitors TC are formed in the substrate 10. The formation of the deep trench capacitors TC may, for example, include: performing photolithography and etching processes to form deep trenches DT in the substrate 10, which extend through the device layer 103 and the buried oxide layer 102 optionally to a predetermined depth (e.g., several microns) in the doped substrate layer 101; and forming the deep trench capacitors in the deep trenches DT. The formation of each deep trench capacitor may include: first forming a node dielectric layer 201 in the deep trench DT, which covers a surface of the doped substrate layer 101 exposed in the deep trench DT and optionally a part of a surface of the buried oxide layer 102 exposed in the deep trench DT; and then forming an inner electrode IE in the deep trench DT. The formation of the inner electrode IE may, for example, include first forming a stop layer 202 in the deep trench DT. The stop layer 202 may include titanium nitride (TiN), tantalum nitride (TaN) or another metal with low ohmic contact resistivity. The stop layer 202 covers a surface of the node dielectric layer 201, with its top being optionally lower than a top of the node dielectric layer 201. A doped polysilicon layer 203 may be deposited to fill the deep trench DT, and an etch-back or planarization process may follow to remove the doped polysilicon layer 203 deposited outside the deep trench DT. The stop layer 202 and the doped polysilicon layer 203 within the deep trench DT constitute the inner electrode IE.

In this embodiment, the inner electrodes IE extends through the device layer 103 and the buried oxide layer 102 into the doped substrate layer 101 in the substrate 10. The deep trench capacitor TC includes the deep trench DT, the node dielectric layer 201 covering a part of an inner surface of the deep trench DT and the inner electrode IE, while the doped substrate layer 101 serve as the other electrode of the deep trench capacitor TC (or referred to as an outer electrode).

As shown in FIGS. 1A to 1C, the device layer 103 in the substrate 10 and the inner electrodes IE in the deep trenches TC are etched and patterned, exposing the buried oxide layer 102. During the etching process, the buried oxide layer 102 may also be partially removed. As a result of the etching process, the remaining device layer 103 forms fins 103a, and remaining portions of the inner electrodes IE form fin contacts 203a connected to the respective fins 103a.

Figure 2:
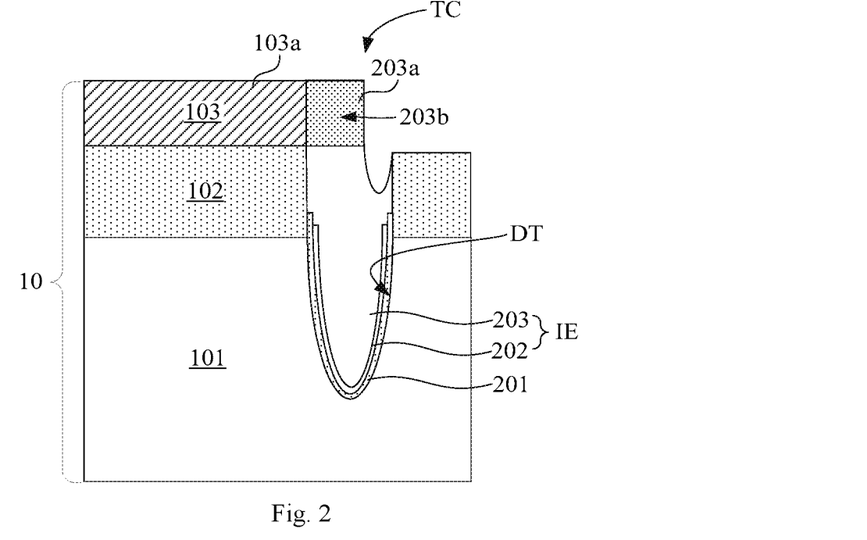
FIG. 2 is a schematic diagram showing ion implantation on an upper portion of an inner electrode according to an embodiment of the present invention.

In order to reduce contact resistance between the fin contacts 203a and doped regions in subsequently formed transistors, with reference to FIG. 2 (a cross-sectional view taken along the same line as FIG. 1B), optionally after the formation of the deep trench capacitors TC and before or after the formation of the fins 103a, ion implantation may be performed using photoresist as a mask to form heavily doped regions 203b in upper portions of the inner electrodes IE. In this way, the fin contacts 203a have an increased dopant ion concentration, which can reduce said contact resistance. The heavily doped regions 203b have a depth that is, for example, smaller than or equal to the thickness of the device layer 103.

Figure 3:
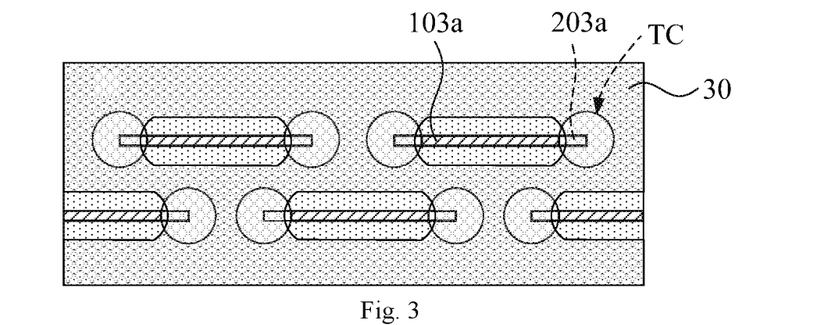
FIG. 3 is a schematic plan view showing the formation of a word line isolation layer on the substrate according to another embodiment of the present invention.
Figure 4:
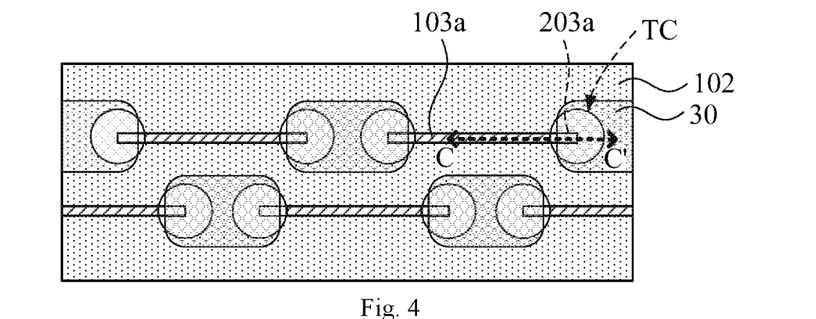
FIG. 4 is a schematic plan view showing the formation of a word line isolation layer on the substrate according to an embodiment of the present invention.

Next, a word line isolation layer is formed on the substrate 10 to insulate and isolate the inner electrodes IE from word lines subsequently formed on the substrate 10 and to prevent each inner electrode IE from shorting to any other subsequently formed electrical component (e.g., a source/drain epitaxial structure of a transistor) that is supposed to be isolated therefrom. As shown in FIG. 3, in an embodiment, the word line isolation layer 30 covers a top surface of the substrate 10 formed thereon with the fins 103a and the fin contacts 203a, while the fins 103a and respective surrounding regions are exposed in respective openings in the word line isolation layer 30. As shown in FIG. 4, in another embodiment, the word line isolation layer 30 is formed on the deep trench capacitors TC and respective portions of the buried oxide layer 102 surrounding the deep trench capacitors TC, while the fins 103a and the rest of the substrate 10 are exposed. The following description is set forth in the context of the embodiment shown in FIG. 4 as an example.

Figure 5:
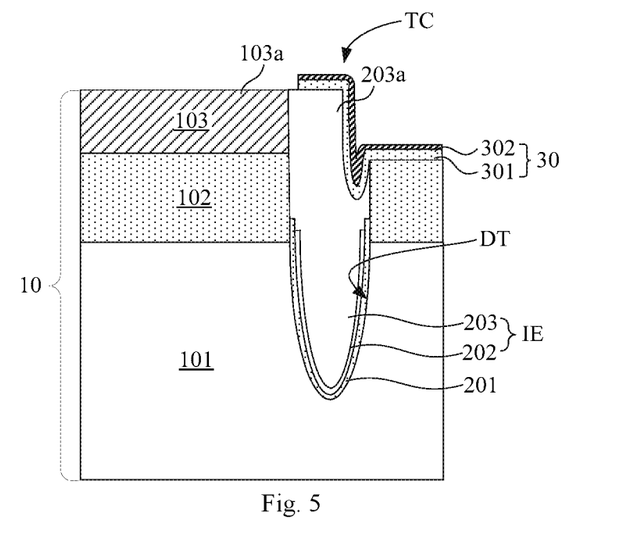
FIG. 5 is a schematic cross-sectional view showing the formation of a word line isolation layer on the substrate according to an embodiment of the present invention.
Figure 6:
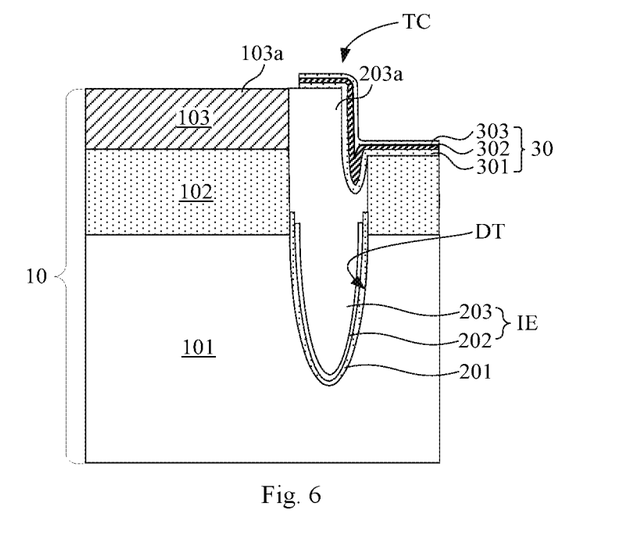
FIG. 6 is a schematic cross-sectional view showing the formation of a word line isolation layer on the substrate according to another embodiment of the present invention.

FIGS. 5 and 6 are exemplary cross-sectional views taken along CC' of FIG. 4. Referring to FIGS. 5 and 6, the word line isolation layer 30 is formed so as to cover surfaces of the buried oxide layer 102, the fin contacts 203a and the inner electrodes IE between the buried oxide layers 102 and the fin contacts 203a (i.e., the portions of the inner electrodes E1 in the respective deep trenches DT surrounding the respective fin contacts 203a), while the fins 103a are exposed from the word line isolation layer 30.

The word line isolation layer 30 includes, for example, multiple layers of materials, including a high-k dielectric layer 302. This is advantageous because, in a subsequent etching process for forming spacers, the high-k dielectric layer 302 can protect the inner electrodes IE between the fin contacts 203a and the buried oxide layer 102 from exposure which may lead to a reliability problem. The high-k dielectric layer 302 may have a dielectric constant that is, for example, greater than 3.9. In particular, the high-k dielectric layer 302 may include, for example, at least one of HfO, HfSiO$_x$ and Al$_2$O$_3$, each of which has a desirable etch selectivity with respect to both silicon oxide and silicon nitride. However, the present invention is not limited to protecting the inner electrodes IE from exposure with the high-k dielectric layer 302, and other materials are also possible.

As shown in FIG. 5, the word line isolation layer 30 may include a bottom dielectric layer 301 and the high-k dielectric layer 302 located on a surface of the bottom dielectric layer 301. The bottom dielectric layer 301 is, for example, an ONO (silicon oxide/silicon nitride/silicon oxide) stack or a silicon oxide layer. However, the present invention is not so limited. As shown in FIG. 6, in an embodiment, the word line isolation layer 30 includes a bottom dielectric layer 301, the high-k dielectric layer 302 on the bottom dielectric layer 301 and a top dielectric layer 303 on the high-k dielectric layer 302. Both the bottom dielectric layer 301 and the top dielectric layer 303 may be silicon oxide, for example. The following description is set forth in the context of the embodiment shown in FIG. 5 as an example.

For example, the formation of the word line isolation layer 30 on the substrate 10 may include: forming a multilayer dielectric film on the substrate 10; and removing portions of the multilayer dielectric film and taking the remaining multilayer dielectric film as the word line isolation layer 30. In the word line isolation layer 30 formed in this way, the various dielectric layers can substantially have the same coverage. The removal of the portions of the multilayer dielectric film may be accomplished by patterning the top dielectric layer using a photolithography process and a dry or wet etching process and then performing a dry or wet etching process on the underlying dielectric layer(s) using the patterned top dielectric layer as a mask. In this process, the fins 103a and the buried oxide layer 102 surrounding the deep trench capacitors TC may also be partially etched away.

Figure 7A:
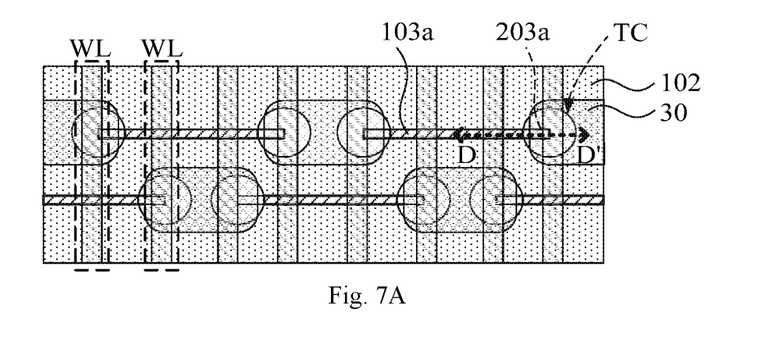
FIG. 7A is a schematic plan view showing the formation of word lines on the substrate according to an embodiment of the present invention.
Figure 7B:
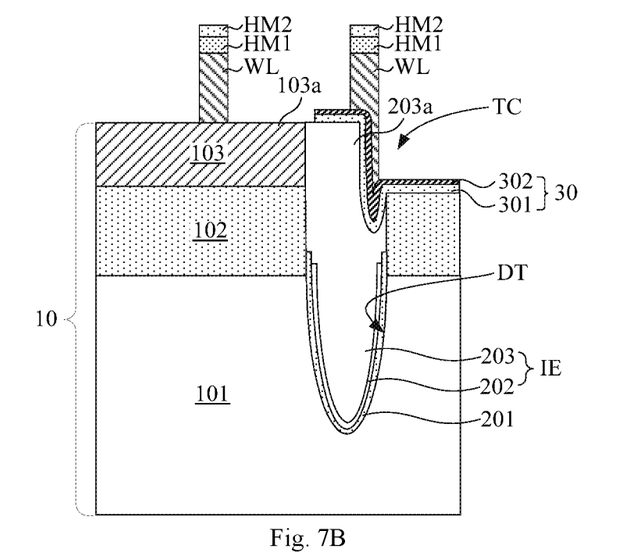
FIG. 7B is a schematic cross-sectional view taken along line DD' of FIG. 7A.

FIG. 7A is a schematic plan view showing the formation of word lines on the substrate according to an embodiment of the present invention. FIG. 7B is a schematic cross-sectional view taken along line DD' of FIG. 7A. Referring to FIGS. 7A and 7B, the word lines WL are then formed on the substrate 10. At least one of the word lines WL intersects the fins 103a and thereby provide a gate of a transistor to be formed on the surface of each fin 103a, and at least one of the word lines WL passes over and is separated by the word line isolation layer 30 from the inner electrodes IE (indicated by the dash boxes in FIG. 7A). The word line isolation layer 30 insulates the word lines WL from the inner electrodes IE. The word lines WL are, for example, formed of polysilicon. The formation of the word lines WL may be accomplished by depositing and etching a polysilicon layer. During the etching of the polysilicon layer, hard masks (e.g., a silicon nitride hard mask HM1 and a silicon oxide hard mask HM2 stacked thereon, as shown in FIG. 7B) may be used to provide protection. Before the formation of the word lines WL on the substrate 10, a gate dielectric layer (not shown) may be formed on the fins 103a.

In an embodiment, the word lines WL formed are dummy word lines, which may be subsequently removed after spacers and source/drain epitaxial structures are formed on opposite sides thereof to form gate deep trenches. Moreover, a replacement metal gate (RMG) technique may be utilized to form metal word lines in the gate deep trenches.

Figure 8A:
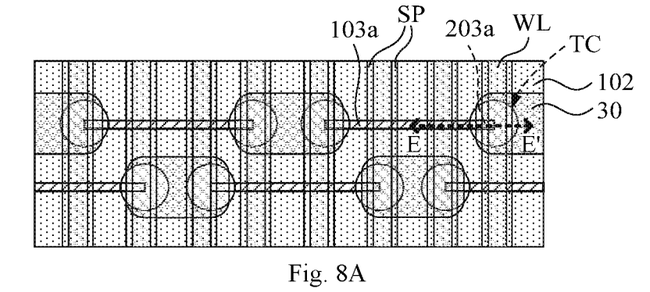
FIG. 8A is a schematic plan view showing the formation of spacers on opposite sides of the word lines according to an embodiment of the present invention.
Figure 8B:
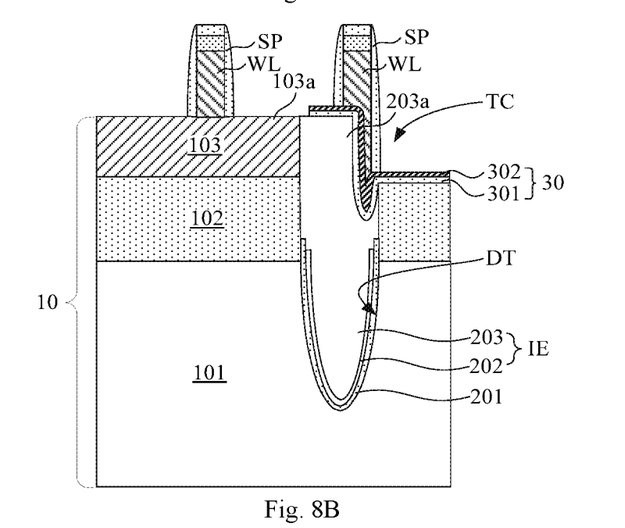
FIG. 8B is a schematic cross-sectional view taken along line EE' of FIG. 8A.

FIG. 8A is a schematic plan view showing the formation of spacers on opposite sides of the word lines according to an embodiment of the present invention. FIG. 8B is a schematic cross-sectional view taken along line EE' of FIG. 8A. Referring to FIGS. 8A and 8B, the spacers SP are formed on opposite sides of the word lines WL, with the word line isolation layer 30 still covering the surfaces of the inner electrodes IE between the buried oxide layer 102 and the fin contacts 203a. As an example, the formation of the spacers SP may include: depositing a silicon oxide layer on the top surface of the substrate 10 formed thereon with the word lines WL; and then etching the silicon oxide layer using an anisotropic etching process, exposing the silicon oxide hard mask HM2 and top surfaces of the fins 103a. The remaining silicon oxide layer covering sidewalls of the word lines WL forms the spacers SP.

As shown in FIG. 8B, during the formation of the spacers SP, the word line isolation layer 30 can protect the inner electrodes IE. In particular, since the word line isolation layer 30 covers the surfaces of the inner electrodes IE between the buried oxide layer 102 and the fin contacts 203a, it not only insulates and isolates the word lines WL from the inner electrodes IE, but also prevents the inner electrodes IE between the buried oxide layer 102 and the fin contacts 203a from being exposed and hence from subsequently undergoing possible epitaxial growth thereon, which may affect the reliability of the semiconductor structure being fabricated. According to some embodiments of the present invention, in order to reduce damage caused to the word line isolation layer 30 by the etching process for forming the spacers, the high-k dielectric layer 302 in the word line isolation layer 30 has a sufficiently high etch selectivity with respect to the material of the spacers SP. After the formation of the spacers SP, source/drain ion implantation may be performed on the fins on opposite sides of the word lines WL to form source and drain regions of the transistors to be formed on the surfaces of the fins 103a.

Figure 9A:
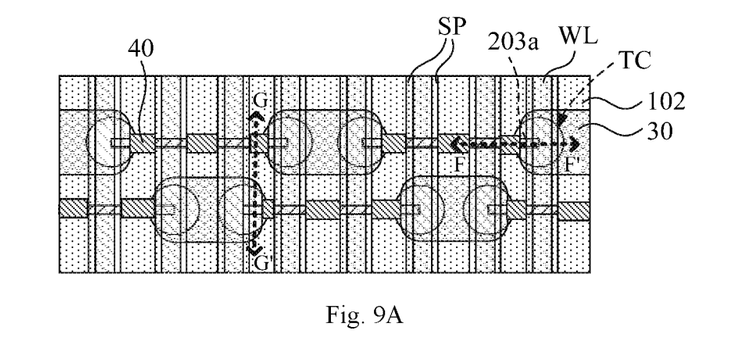
FIG. 9A is a schematic cross-sectional view showing the formation of source/drain epitaxial structures on surfaces of the fins on opposite sides of the word lines according to an embodiment of the present invention.

FIG. 9A is a schematic cross-sectional view showing the formation of source/drain epitaxial structures on the surfaces of the fins on opposite sides of the word lines according to an embodiment of the present invention. As shown in FIG. 9A, an epitaxial process is carried out to form the source/drain epitaxial structures 40 on the surfaces of the fins 103a on opposite sides of the word lines. Each of the source/drain epitaxial structures 40 is connected to a source or drain region on one side of one word line. This can extend the source and drain regions of the transistors to be formed on the surface of the fin 103a.

Figure 9B:
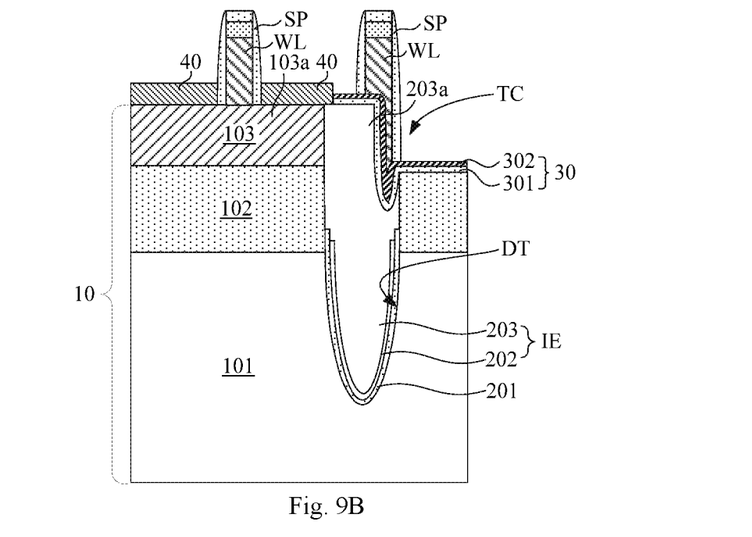
FIG. 9B is a schematic cross-sectional view taken along line FF' of FIG. 9A.
Figure 9C:
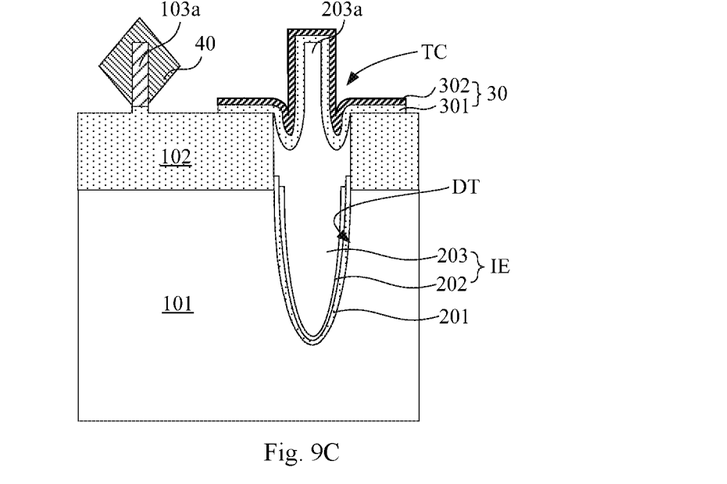
FIG. 9C is a schematic cross-sectional view taken along line GG' of FIG. 9A.

FIG. 9B is a schematic cross-sectional view taken along line FF' of FIG. 9A. FIG. 9C is a schematic cross-sectional view taken along line GG' of FIG. 9A. Referring to FIGS. 9A to 9C, in an embodiment, before the epitaxial process is performed, in addition to the top surfaces of the inner electrodes IE between the fin contacts 203a and the buried oxide layer 102 (i.e., the portions of the inner electrodes IE in the deep trenches DT surrounding the respective fin contacts 203a), a top surface portion of each fin contact 203a in contact with the respective fin 103 and without any word line WL or spacer SP formed thereon is almost entirely covered by the word line isolation layer 30. Consequently, on the one hand, since the top surfaces of the portions of the inner electrodes IE in the deep trenches DT surrounding the respective fin contacts 203a are covered by the word line isolation layer 30, epitaxial growth will not occur thereon in the epitaxial process. Otherwise, if the inner electrodes IE are exposed, uncontrollable epitaxial growth may take place thereon and possibly lead to the aforementioned short circuit problem. On the other hand, as the top surface portion of each fin contact 203a in contact with the respective fin 103 and without any word line WL or spacer SP formed thereon is almost entirely covered by the word line isolation layer 30, a top surface portion of the specific fin contact 203a in connection with a respective source/drain epitaxial structure 40, which is available for epitaxial growth, is not large enough to impart desirable current collection ability to the respective inner electrode IE. For example, for eDRAM, compared to enhancing epitaxial growth on the top surface portion of the fin contact 203a in connection with the source/drain epitaxial structure 40, additionally covering this top surface portion of the fin contact 203a with the word line isolation layer 30 will reduce a drain saturation current Idsat of a respective transistor to be formed. In order to increase current collection ability of the inner electrodes IE, it is desirable to reduce the word line isolation layer 30 that covers the top surface portions of the fin contacts 203a in connection with the source/drain epitaxial structures 40.

Figure 10A:
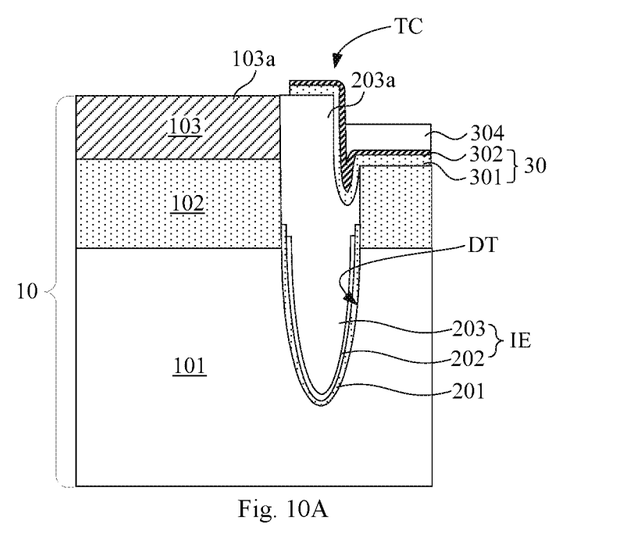
FIGS. 10A to 10C are schematic cross-sectional views showing the formation of a word line isolation layer on the substrate according to a further embodiment of the present invention.
Figure 10B:
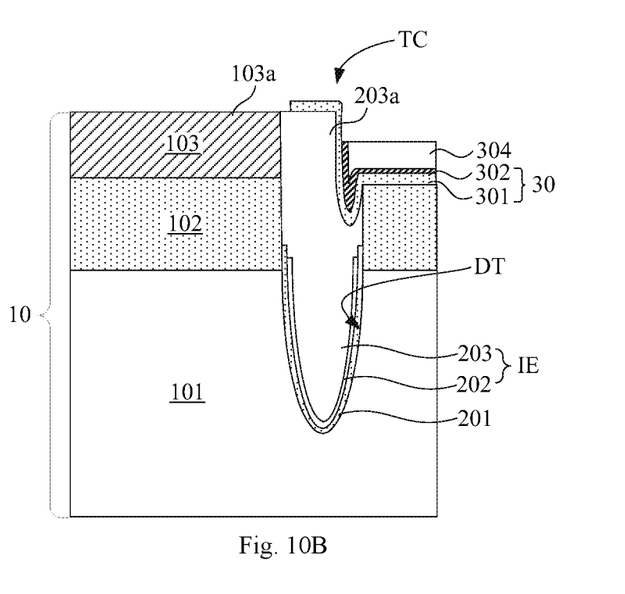
Figure 10C:
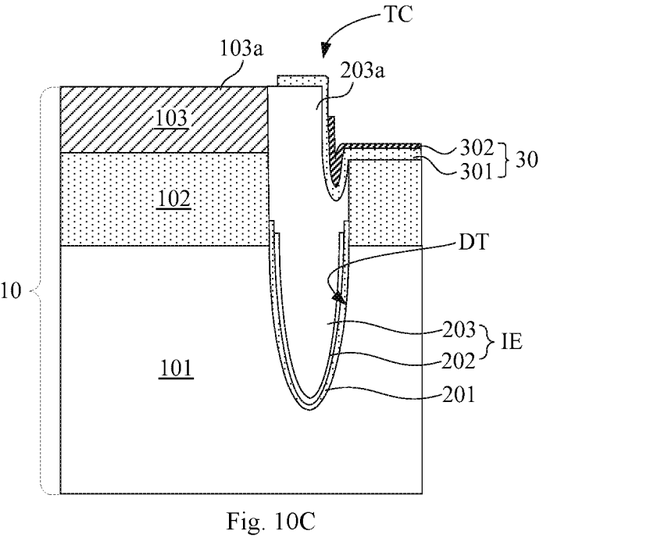

FIGS. 10A to 10C are schematic cross-sectional views showing the formation of a word line isolation layer on the substrate according to a further embodiment of the present invention. Specifically, FIG. 10A is a cross-sectional view showing the formation of a planarization layer 304 over the substrate 10 on the patterned multilayer dielectric film as shown in FIG. 5. Referring to FIG. 10A, according to a further embodiment, the planarization layer 304 is formed on the patterned multilayer dielectric film as shown in FIG. 5, for example, by coating a planarization material on the substrate 10 and the deep trench capacitors TC and then etching back the planarization material. A top surface of the planarization layer 304 is lower than the top surfaces of the fins 103a and the fin contacts 203a. The planarization layer 304 covers the multilayer dielectric film between the buried oxide layer 102 and the fin contacts 203a, while the multilayer dielectric film located on the top surfaces of the fin contacts 203a is exposed.

FIG. 10B is a cross-sectional view showing selective etching of the word line isolation layer 30 of FIG. 10A. Referring to FIG. 10B, with the planarization layer 304 serving a mask, the exposed high-k dielectric layer 302 in the word line isolation layer 30 is etched away. FIG. 10C is a cross-sectional view showing removal of the planarization layer 304 of FIG. 10B. Referring to FIG. 10C, the planarization layer 304 is then removed. In this embodiment, the multilayer dielectric film that has undergone the processes shown in FIGS. 10A to 10C is taken as the word line isolation layer 30.

As a result of the above processes, the word line isolation layer 30 has different dielectric layer compositions at different portions. For example, the portions of the word line isolation layer 30 located on the top surfaces of the fin contacts 203a are composed of the ONO stack, while the portions of the word line isolation layer 30 located on the top surfaces of the inner electrodes IE between the fin contacts 203a and the buried oxide layer 102 are composed of the ONO stack and the high-k dielectric layer 302 on the ONO stack. Compared with the portions of the word line isolation layer 30 located on the top surfaces the portions of the inner electrodes IE in the deep trenches DT surrounding the respective fin contacts 203a, portions of the word line isolation layer 30 located on the top surfaces of the fin contacts 203a are thinner and have a lower etch selectivity with respect to the material of the spacers.

Figure 11:
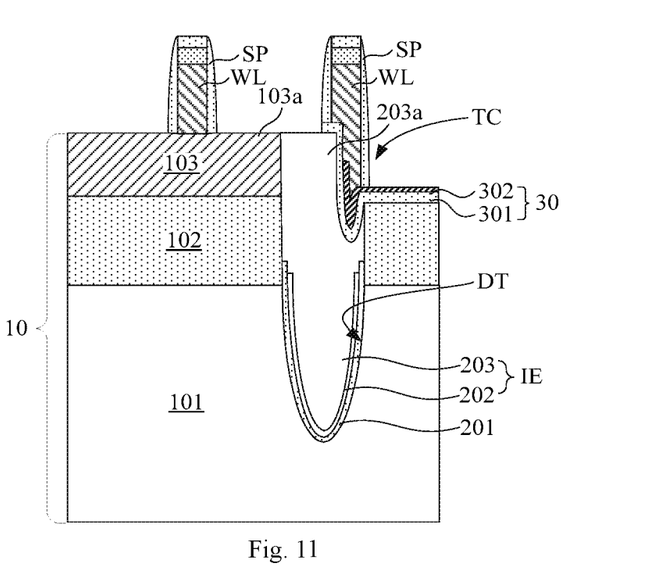
FIG. 11 is a schematic cross-sectional view showing the formation of word lines and spacers on the substrate according to a further embodiment of the present invention.

FIG. 11 is a schematic cross-sectional view showing the formation of word lines and spacers on the substrate according to a further embodiment of the present invention. Referring to FIG. 11, according to a further embodiment, the word lines WL are formed on the substrate 10 of FIG. 10C. At least one of the word lines WL intersects the fins 103a and thereby provide a gate of a transistor to be formed on the surface of each fin 103a, and at least one of word lines WL passes over and is separated by the word line isolation layer 30 from the inner electrodes IE. The word line isolation layer 30 insulates the word lines WL from the inner electrodes IE. Before the formation of the word lines WL on the substrate 10, a gate dielectric layer (not shown) may be formed on the fins 103a.

Additionally, the spacers SP are formed on opposite sides of the word lines WL, with the word line isolation layer 30 still covering the surfaces of the inner electrodes IE between the buried oxide layer 102 and the fin contacts 203a. Reference can be made to the description of the previous embodiment for more details of the formation of the word lines WL and the spacers SP. In this embodiment, because of a lower etch selectivity of the word line isolation layer 30 on the top surfaces of the fin contacts 203a with respect to the material of the spacers SP, during the etching process for forming the spacers SP, the word line isolation layer 30 on the top surface portions of the fin contacts 203a in contact with the fins 103 and without any word line WL or spacer SP formed thereon is removed. As a result, portions of the top surface of the fin contacts 203a in contact with the fins 103 are sufficiently exposed. Meanwhile, the word line isolation layer 30 covering the top surfaces of the portions of the inner electrodes IE in the deep trenches DT surrounding the respective fin contacts 203a is left after the etching process for forming the spacers SP thanks to a higher etch selectivity with respect to the material of the spacers.

Figure 12A:
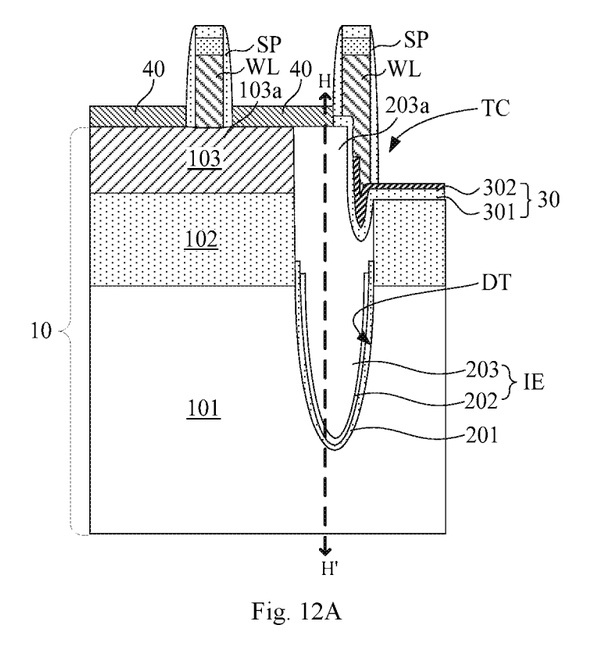
FIG. 12A is a schematic cross-sectional view showing the formation of source/drain epitaxial structures on the fin surfaces on opposite sides of gates according to a further embodiment of the present invention.
Figure 12B:
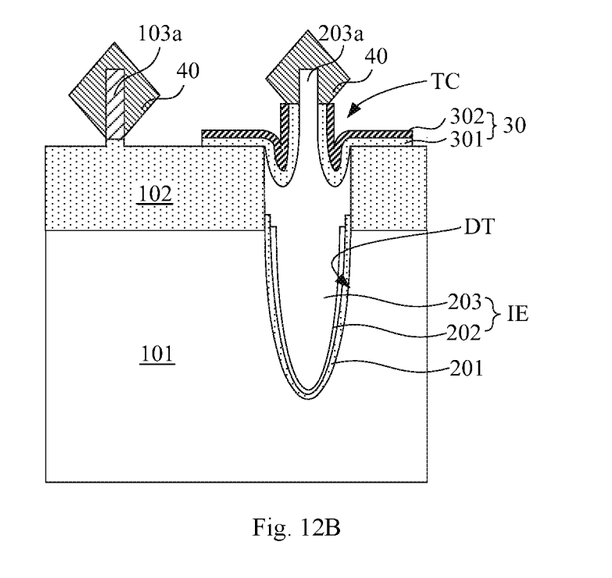
FIG. 12B is a schematic cross-sectional view taken along another direction showing the formation of the source/drain epitaxial structures on the fin surfaces on opposite sides of the gates according to a further embodiment of the present invention.

FIG. 12A is a schematic cross-sectional view showing the formation of source/drain epitaxial structures on the fin surfaces on opposite sides of the gates according to a further embodiment of the present invention. FIG. 12B is another schematic cross-sectional view showing the formation of the source/drain epitaxial structures on the fin surfaces on opposite sides of the gates according to a further embodiment of the present invention. FIG. 12A is taken along the same line as FIG. 11, while FIG. 12B is, for example, taken along line HH' of FIG. 12A that is perpendicular to the line along which FIG. 12A is taken. Referring to FIGS. 12A and 12B, an epitaxial process is carried out to form the source/drain epitaxial structures 40 on the surfaces of the fins 103a on opposite sides of the word lines of FIG. 11. Each of the source/drain epitaxial structures 40 is connected to a source or drain region on one side of one word line. In this embodiment, since the word line isolation layer 30 on the top surface of the portions of the fin contacts 203a in contact with the fins 103 and without any word line WL or spacer SP formed thereon has been removed, during the epitaxial process, epitaxial growth takes place both on the top surfaces of the portions of the fin contacts 203a in contact with the fins 103 and on side surfaces of portions of the fin contacts 203a connected to said top surface portions. This results in increased contact areas, and hence reduced contact resistance, between the fin contacts 203a and the source and drain regions of the transistors connected thereto, helping enhance current collection ability of the inner electrodes IE and improve drain saturation currents Idsat in the eDRAM device. Meanwhile, since the portions of the inner electrodes IE in the deep trenches DT surrounding the respective fin contacts 203a are covered by the word line isolation layer 30, areas of the inner electrodes for epitaxial growth are effectively controlled, avoiding the epitaxial structures formed on the surfaces of the inner electrodes from coming into connection with any electrical structure supposed to be isolated from the inner electrodes IE (e.g., a source/drain epitaxial structure of another transistor). Such connection may lead to a short circuit, which will affect the reliability of the device being fabricated.

Embodiments of the present invention also relate to a semiconductor structure, for example, of eDRAM architecture. The semiconductor structure may be fabricated using any of the methods according to the above embodiments.

Referring to FIGS. 1 to 12B, the semiconductor structure comprises:

a substrate 10 comprising a doped substrate layer 101, a buried oxide layer 102 and a device layer 103, wherein the device layer 103 forms fins 103a;

deep trench capacitors TC in the substrate 10, wherein the TC comprises an inner electrode IE in a deep trench DT formed in the substrate 10 and a node dielectric layer 201 between the inner electrode IE and the doped substrate layer 101, both the deep trench DT and the inner electrode IE extending through the device layer 103 and the buried oxide layer 102 into the doped substrate layer 101, the inner electrode IE comprising a fin contact 203a connected to one of the fins 103a;

word lines WL formed on the substrate 10, at least one of which intersects the fins 103a and thereby provide a gate of a transistor formed on surface of each fin 103a, wherein opposite side of the word lines WL are covered by spacers SP;

a word line isolation layer 30 formed on the substrate 10, wherein at least one of the word lines WL passes over and is separated by the word line isolation layer 30 from the inner electrodes IE, and wherein the word line isolation layer 30 covers surfaces of the inner electrodes IE between the buried oxide layer 102 and the fin contacts 203a, with the fins 103a being exposed therefrom; and source/drain epitaxial structures 40 formed on the surfaces of the fins 103a on opposite sides of the word lines WL.

In this semiconductor structure, the word line isolation layer 30 not only isolates and insulates the word lines WL from the inner electrodes IE, but also covers the surfaces of the portions of the inner electrodes IE between the buried oxide layers 102 and the fin contacts 203a to protect the portions of the inner electrodes IE from exposure during an epitaxial process. In this way, the epitaxial structures formed on the surfaces of the inner electrodes can be avoided from coming into connection with any electrical structure supposed to be isolated from the inner electrodes IE (e.g., a source/drain epitaxial structure of another transistor). Such connection may lead to a short circuit, which will affect the reliability of the device.

The inner electrodes IE may include doped polysilicon, for example. In an embodiment, the inner electrodes IE are doped polysilicon, and the fin contacts 203a have a higher dopant concentration than the rest of the inner electrodes IE. In an embodiment, the word lines include polysilicon or a metal. A gate dielectric layer (not shown) may be formed between the word lines WL and the fins 103a, and sidewalls of the gate dielectric layer may be covered by the spacers SP.

Optionally, the word line isolation layer 30 may include a bottom dielectric layer 301 and a high-k dielectric layer 302 located on the bottom dielectric layer 301. The bottom dielectric layer 301 may be, for example, an ONO stack or a silicon oxide layer. The word line isolation layer 30 may further include a top silicon oxide layer located on the high-k dielectric layer 302.

In some embodiments, the word line isolation layer 30 further covers a top surface of at least a portion of each fin contact 203a and structured differently at portions on the top surfaces of the fin contacts 203a than at portions covering the surfaces of the inner electrodes IE between the buried oxide layer 102 and the fin contacts 203a. The portions of the word line isolation layer 30 located on the top surfaces of the portion of the fin contacts 203a are composed of only the bottom dielectric layer 301 (e.g., an ONO stack or a silicon oxide layer) and do not include a high-k dielectric layer 302, while the portions of the word line isolation layer 30 located on the surfaces of the portion of the inner electrodes IE between the buried oxide layer 102 and the fin contacts 203a are composed of both the bottom dielectric layer 301 and the high-k dielectric layer 302. That is, in the word line isolation layer 30, the dielectric layer underlying the high-k dielectric layer 302 further extends over at least a part of the top surface of each fin contact 203a. This ensures that, in a spacer formation process, the surfaces of the portion of the inner electrodes IE between the buried oxide layer 102 and the fin contacts 203a are not exposed, while top surface of the portions of the fin contacts 203a in contact with the fins 103a and without any word line WL or spacer SP formed thereon are exposed. In this way, epitaxial structures connected to the source/drain epitaxial structures are formed on the top surface of the portions of the fin contacts 203a in contact with the fins 103a, which can enhance current collection ability of the inner electrodes IE and improve drain saturation currents Idsat in the eDRAM device.

It is to be noted that the embodiments disclosed herein are described in a progressive manner. As the semiconductor structure embodiments correspond to the method embodiments, they are described relatively briefly, and reference can be made to the description of the method embodiments for any details of interest in them.

The foregoing description is merely that of several preferred embodiments of the present invention and is not intended to limit the scope of the claims of the invention in any way. Any person of skill in the art may make various possible variations and changes to the disclosed embodiments in light of the methodologies and teachings disclosed hereinabove, without departing from the spirit and scope of the invention. Accordingly, any and all such simple variations, equivalent alternatives and modifications made to the foregoing embodiments based on the essence of the present invention without departing from the scope of the embodiments are intended to fall within the scope of protection of the invention.

What is claimed is:

1. A method of forming a semiconductor structure, comprising:
   providing a substrate comprising a doped substrate layer, a buried oxide layer and a device layer;
   forming at least one deep trench in the substrate, wherein each deep trench extends through the device layer and the buried oxide layer into the doped substrate layer;
   forming a corresponding deep trench capacitor in each deep trench, wherein the deep trench capacitor comprises a node dielectric layer covering a part of an inner surface of the deep trench, and an inner electrode filled in the deep trench, and wherein the node dielectric layer separates the inner electrode from the doped substrate layer;
   etching the device layer and the inner electrode to expose the underlying buried oxide layer, wherein the etched device layer forms at least one fin, and a portion of the etched inner electrode forms a fin contact connected to the corresponding fin;
   forming a word line isolation layer on the substrate, wherein the fin is exposed from the word line isolation layer;
   forming a plurality of word lines on the substrate, wherein at least one of the word lines intersects the at least one fin and provides a gate of a transistor on a surface of each fin and at least one of the word lines passes over and is separated by the word line isolation layer from the inner electrodes;
   forming spacers on sidewalls of each word line, wherein the word line isolation layer covers a surface of a portion of the inner electrode between the buried oxide layer and the fin contact; and
   performing an epitaxial process to form a source/drain epitaxial structure on the surface of the fin on opposite sides of the gate.

2. The method of claim 1, wherein the formation of the word line isolation layer on the substrate comprises:
   forming a multilayer dielectric film on the substrate, wherein the multilayer dielectric film comprises a bottom dielectric layer and a high-k dielectric layer located on the bottom dielectric layer; and
   removing a portion of the multilayer dielectric film, and a remaining portion of the multilayer dielectric film serves as the word line isolation layer.

3. The method of claim 2, wherein after the portion of the multilayer dielectric film is removed, the formation of the word line isolation layer on the substrate further comprises:
   forming a planarization layer on the multilayer dielectric film, wherein a top surface of the planarization layer is lower than top surfaces of the fin and of the fin contact, and the planarization layer covers a portion of the multilayer dielectric film between the buried oxide layer and the fin contact, and wherein a portion of the multilayer dielectric film on the top surface of the fin contact is exposed;
   removing the high-k dielectric layer in the portion of the multilayer dielectric film on the top surface of the fin contact; and
   removing the planarization layer.

4. The method of claim 2, wherein the multilayer dielectric film comprises a silicon oxide/silicon nitride/silicon oxide (ONO) stack and the high-k dielectric layer located on the ONO stack.

5. The method of claim 2, wherein the multilayer dielectric film comprises a silicon oxide layer and the high-k dielectric layer located on the silicon oxide layer.

6. The method of claim 2, wherein the multilayer dielectric film comprises a bottom silicon oxide layer, the high-k dielectric layer located on the bottom silicon oxide layer and a top silicon oxide layer located on the high-k dielectric layer.

7. The method of claim 1, wherein the inner electrode comprises a doped polysilicon.

8. The method of claim 7, wherein after the formation of the deep trench capacitor and before or after the formation of the fin, the method further comprises:

performing an ion implantation to increase a dopant ion concentration of the fin contact.

* * * * *